US005982824A

United States Patent [19]

Ann

[11] Patent Number: 5,982,824

[45] Date of Patent: *Nov. 9, 1999

[54] METHOD AND APPARATUS FOR AUTOMATIC GAIN CONTROL

[75] Inventor: Bau-Hsing Brian Ann, Parsippany, N.J.

[73] Assignee: Lucent Technologies, Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/573,736

[22] Filed: Dec. 18, 1995

[51] Int. Cl.[6] .............................. H04L 27/08; H03B 5/30; H03C 1/62; H01Q 11/12

[52] U.S. Cl. ............................ 375/345; 375/344; 331/44; 331/158; 455/115; 455/116; 455/117

[58] Field of Search .................................... 375/345, 344; 455/115, 116, 117, 118, 119; 331/44, 158, 176

[56] References Cited

U.S. PATENT DOCUMENTS

| | | | |
|---|---|---|---|
| 4,870,698 | 9/1989 | Katsuyama et al. | 455/67 |
| 5,107,225 | 4/1992 | Wheatley, III et al. | 330/279 |
| 5,222,104 | 6/1993 | Medendorp | 455/239.1 |
| 5,287,555 | 2/1994 | Wilson et al. | 455/115 |
| 5,392,005 | 2/1995 | Bortolini et al. | 331/44 |
| 5,408,697 | 4/1995 | Price et al. | 455/239.1 |
| 5,423,070 | 6/1995 | Vaisanen et al. | 455/76 |
| 5,471,654 | 11/1995 | Okazaki et al. | 455/126 |
| 5,659,884 | 8/1997 | Daughrty, Jr. et al. | 455/67.1 |

*Primary Examiner*—Chi H. Pham
*Assistant Examiner*—Khai Tran

[57] ABSTRACT

In a preferred embodiment, a gain control circuit employs variable gain circuitry and a variable frequency converter, both controlled by a processor. The processor controls the carrier frequency of an RF modulated output signal of the circuit by controlling the frequency converter. The processor also preferably controls the gain of the variable gain circuitry as a function of both the output carrier frequency and temperature, as measured by a temperature sensing element. Preferably, the gain is controlled to maintain a constant gain over specified operating frequency and temperature ranges. The gain control circuit can be employed within a transceiver of a wireless communication terminal. Similar gain control circuitry can be utilized within a base station transceiver in which frequency channels are dynamically allocable among a plurality of gain-controlled amplification circuits.

24 Claims, 8 Drawing Sheets

METHOD AND APPARATUS FOR AUTOMATIC GAIN CONTROL

BACKGROUND OF THE INVENTION

1. Field of the Invention

The present invention relates generally to electrical engineering, and more particularly, to a method and apparatus for automatic gain control that can mitigate the effects of temperature and/or frequency.

2. Description of Related Art

Automatic gain control circuitry forms a portion of many radio transmitter circuits. Such circuitry can control the power level of a modulated signal transmitted by the radio transmitter circuit. Power level control is typically effected by controlling the gain of amplifier circuitry within the portion of the transmitter that amplifies the modulated signal.

Such gain control circuitry is often confronted with a task of maintaining a constant gain (i.e., "gain flatness") of a series chain of transmitter components over the entire operating frequency range. Gain flatness otherwise suffers due to gain or loss variations vs. frequency for most radio frequency (RF) and microwave transmitter components. For example, amplifiers, mixers, and filters often exhibit gain or loss variations across the entire operating frequency range. Moreover, gain or loss of typical transmitter components also varies as ambient temperature changes. The total variation at the output of the transmitter due to frequency variations and/or temperature fluctuations can become quite large and therefore out of a specified tolerance range. FIG. 1 illustrates typical gain vs. frequency and/or temperature of a series chain of transmitter components, which includes at least one conventional amplifier. Gain and output power typically fall off as frequency and/or temperature rise.

Generally, there are two ways to control these gain or loss variations. One such method is to specify each component of the transmitter to within a tight specification to achieve specified tolerances of gain flatness. However, this has proven costly and is often not readily achievable with current radio technology. Another method is to design a feedback loop that monitors the output power of the transmitter and constantly changes the gain so as to stay within a specified tolerance range. However, feedback loops increase the complexity of such transmitter circuitry and can also introduce stability problems that are commonly associated with such feedback loop circuitry.

SUMMARY OF THE INVENTION

Accordingly, in a preferred embodiment of the present invention, a gain control circuit is provided for controlling the gain of amplifier circuitry without the use of feedback loop circuitry.

The gain control circuit of the preferred embodiment is operative to amplify a modulated input signal having signal power at a first carrier frequency, to provide an amplified and frequency translated output signal having signal power at a second, translated carrier frequency (or operating frequency). The gain of the gain control circuit is controlled as a function of the operating frequency, preferably to provide a constant gain over an operating frequency range of the circuit.

The gain control circuit of the preferred embodiment includes a variable frequency converter for converting the input signal to a frequency converted signal having signal power at the operating frequency. The frequency converted signal is amplified by the variable gain circuitry at a gain controlled by a gain control signal originating from a processor.

A memory coupled to the processor has stored data indicative of gain of the variable gain circuitry as a function of frequency. The processor determines an appropriate operating frequency, typically by receiving an external frequency channel control signal, and controls the frequency converter accordingly. The processor retrieves the stored data corresponding to the operating frequency and determines the gain control signal in accordance with the retrieved data, to thereby control gain of the variable gain circuitry.

The gain control circuit of the preferred embodiment can further include a temperature sensing element for measuring temperature conditions of the circuit. In this case, the data stored within the memory is indicative of gain of the variable gain circuitry as a function of frequency and temperature. The gain control signal can then control the variable gain circuitry to provide substantially constant gain over specified operating frequency and temperature ranges.

The gain control circuit of the preferred embodiment can be incorporated within a radio transmitter of a wireless communication terminal. A receiver within the wireless terminal receives a frequency channel control signal radiated in a control channel, and supplies this signal to the processor, which determines therefrom the operating frequency of the gain control circuit.

In another embodiment, a base station transceiver for a wireless telecommunication system includes a plurality of variable gain amplification circuits, each for amplifying and frequency translating a different modulated input signal. The gain of each amplification circuit can be controlled to provide a constant gain over specified operating frequency and/or temperature ranges, by employing a processor and a memory having stored data indicative of gain of each amplification circuit as a function of frequency and/or temperature.

BRIEF DESCRIPTION OF THE DRAWINGS

Further features of the present invention will become readily apparent from the following detailed description, taken in conjunction with the accompanying drawings, wherein like reference numerals designate similar elements or features, for which.

DETAILED DESCRIPTION OF THE PREFERRED EMBODIMENTS

Figure 1:
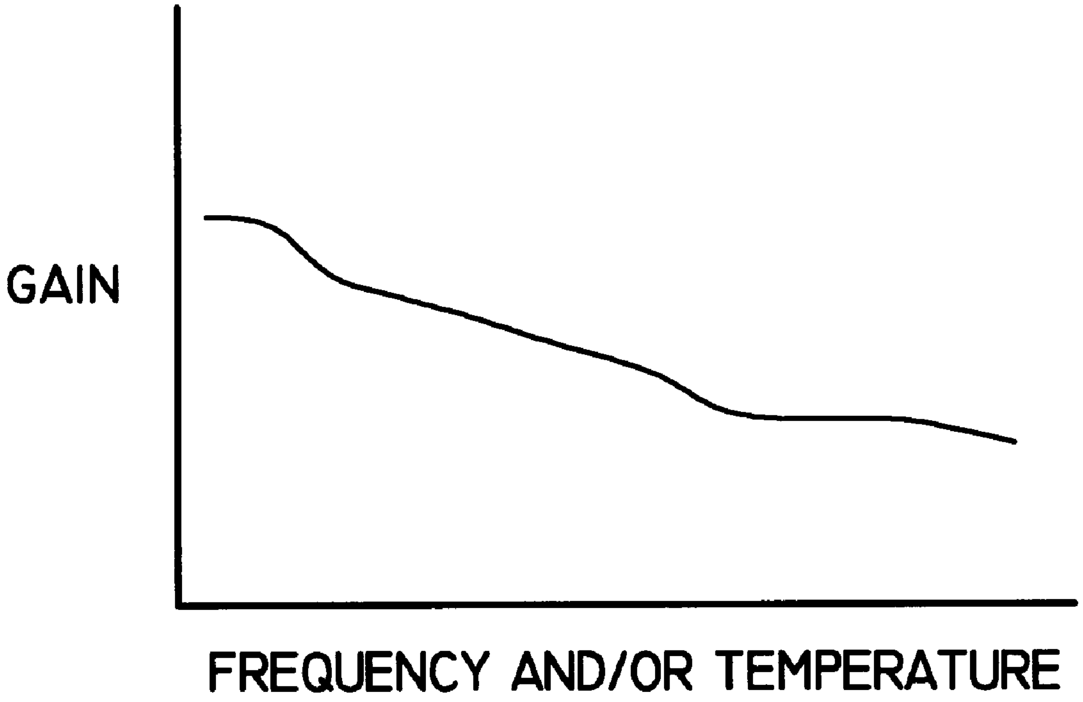
FIG. 1 (PRIOR ART)
FIG. 1 is a graph of gain versus frequency and temperature of a prior art radio transmitter.
Figure 2:
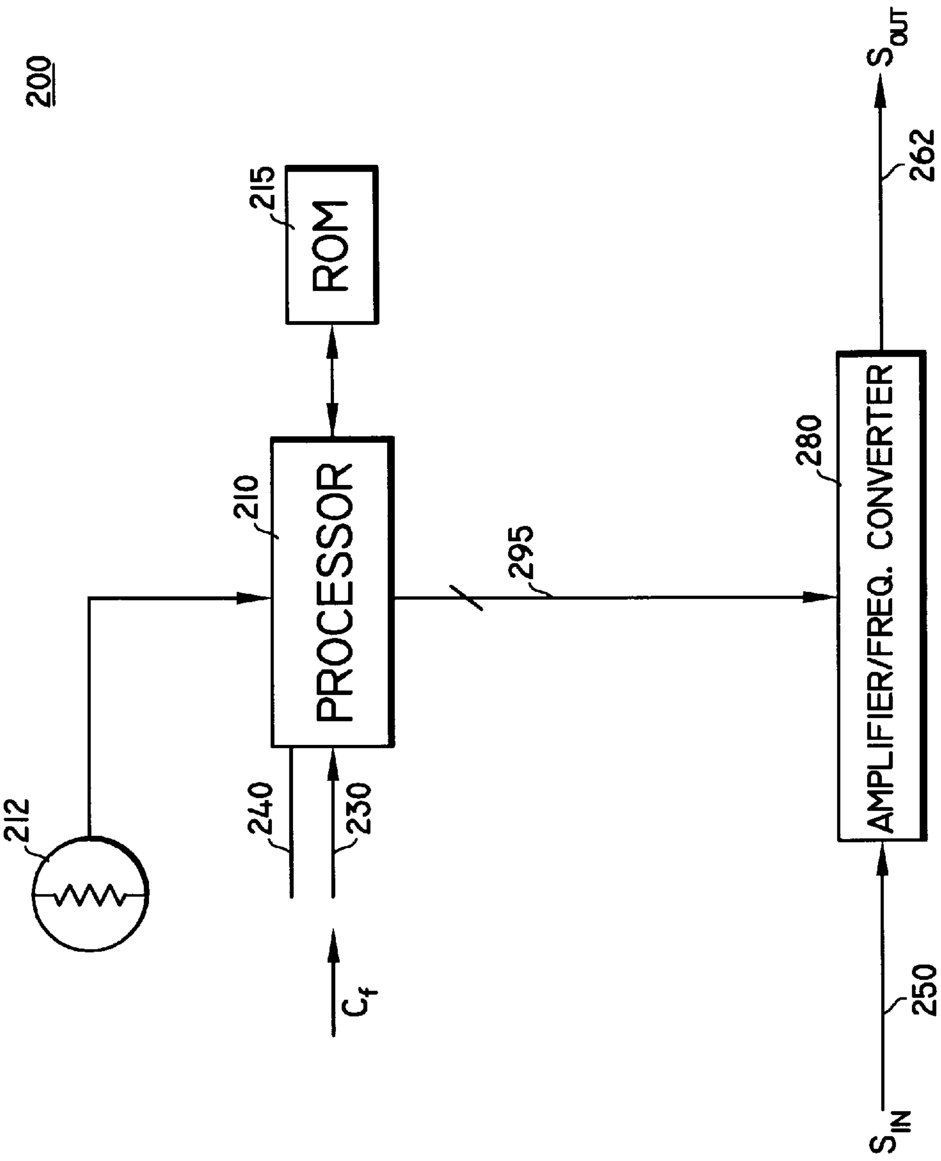
FIG. 2 is a block diagram of an embodiment of a gain control circuit in accordance with the present invention.

FIG. 2 illustrates a functional block diagram of a gain control circuit, referred to generally by reference numeral 200, of an embodiment of the present invention. As will be described below, gain control circuit 200 is particularly suitable for use within the transmission path of a radio transceiver. Such a radio transceiver may be incorporated into various types of radios requiring the transmission of a communication signal in a specified frequency-delimited channel. The communication signal can be either analog or digital and can provide voice and/or data information.

Gain control circuit 200 functions to amplify and frequency translate a modulated, information-bearing input signal $S_{IN}$ on line 250 to produce an amplified output signal $S_{OUT}$ on line 262. Signal $S_{IN}$ has signal power at an input carrier frequency $f_{IN}$ whereas signal $S_{OUT}$ has amplified signal power at a translated carrier frequency $f_{OUT}$. (This frequency $f_{OUT}$ will be referred to hereafter as the operating frequency of the circuit).

Gain control circuit 200 includes processor 210 coupled to temperature sensing element 212 (e.g., a thermistor, a thermometer, etc.) and memory (e.g. Read Only Memory (ROM)) 215. Processor 210 is further coupled to an amplifier and frequency converter circuit 280 via control line set 295. Circuit 280 includes at least one variable frequency converter in series with at least one variable gain amplifier. Circuit 280 receives signal $S_{IN}$ and translates its frequency to $f_{OUT}$ under the control of processor 210 via a control signal on control line set 295. Processor 210 determines an appropriate translated carrier frequency $f_{OUT}$ responsive to a frequency channel control signal $C_f$ applied on line 230. Processor 210 can also control frequency converters of other circuits via one or more optional control lines 240. Processor 210 is also programmed to control the gain of circuit 280 as a function of operating frequency and temperature, by providing at least one gain control signal on control line set 295 to at least one of the variable gain amplifiers therein. This enables gain flatness to be maintained by circuit 280 over specified operating frequency and temperature ranges of the circuit.

It is to be appreciated that processor 210 may be any of a variety of processors known to those skilled in the art. An exemplary processor is the 8085 processor available from INTEL Corporation. As is well known, such microprocessors include a Central Processing Unit (CPU), Random Access Memory (RAM), Read Only Memory (shown separately as ROM 215) and an Input/Output (I/O) interface.

Figure 3:
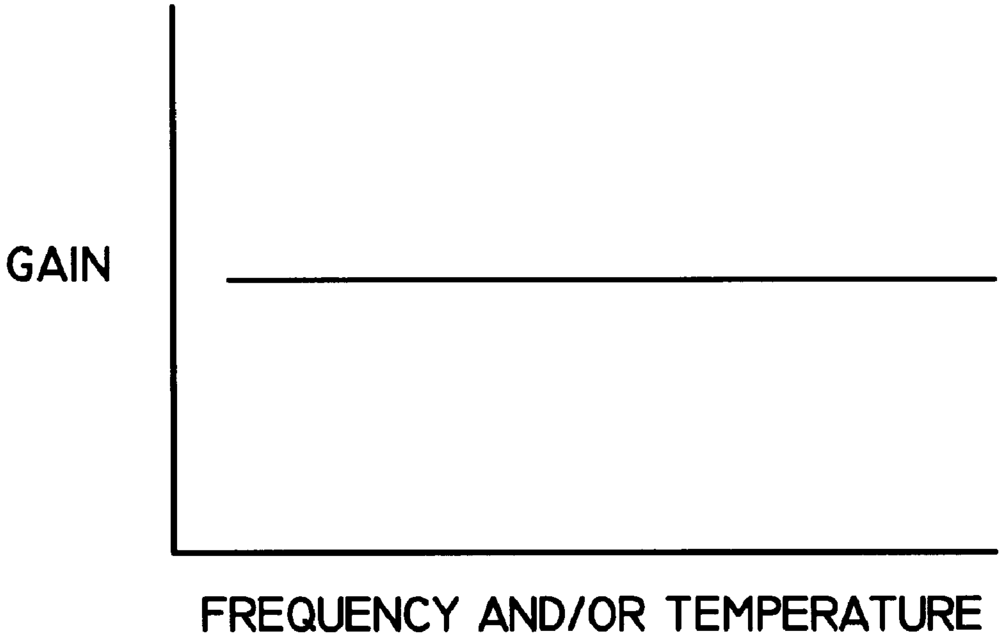
FIG. 3 is a graph of gain versus frequency and temperature of a gain control circuit in accordance with the present invention.

The gain characteristics of circuit 280 as a function of frequency and temperature are determined from prior measurement or otherwise, and are stored as data within ROM 215. These gain characteristics are preferably established by gain measurements of circuit 280 assembled as a unit, rather than by separate measurements on the individual components within the circuit. The data stored within ROM 215 may be stored in various ways, such as, for example, as raw gain data or as gain correction or calibration data. In any case, the stored data is used to correct the gain of the one or more variable gain amplifiers within circuit 280 as operating temperature and/or frequency changes, to maintain gain flatness, as illustrated in FIG. 3. Since the input power level of signal $S_{IN}$ is always maintained within a specified power level range, the output power of signal $S_{OUT}$ can also be maintained within a specified range, due to the flat gain characteristics of circuit 200.

It is noted that while the term "gain" is typically used to refer to an increase in signal strength through an electronic device, it is used herein to denote the ratio of output signal strength to input signal strength of a given device. Hence, the gain may be less than unity for a given variable amplifier within circuit 280, in which case that "amplifier" may be realized by using a variable attenuator.

Moreover, some applications require a different gain at certain operating frequencies rather than a frequency-independent gain. Gain control circuit 200 can be configured to realize this result by having ROM 215 store gain data indicative of higher or lower gain at specified operating frequencies, as the case may be.

Figure 4A:
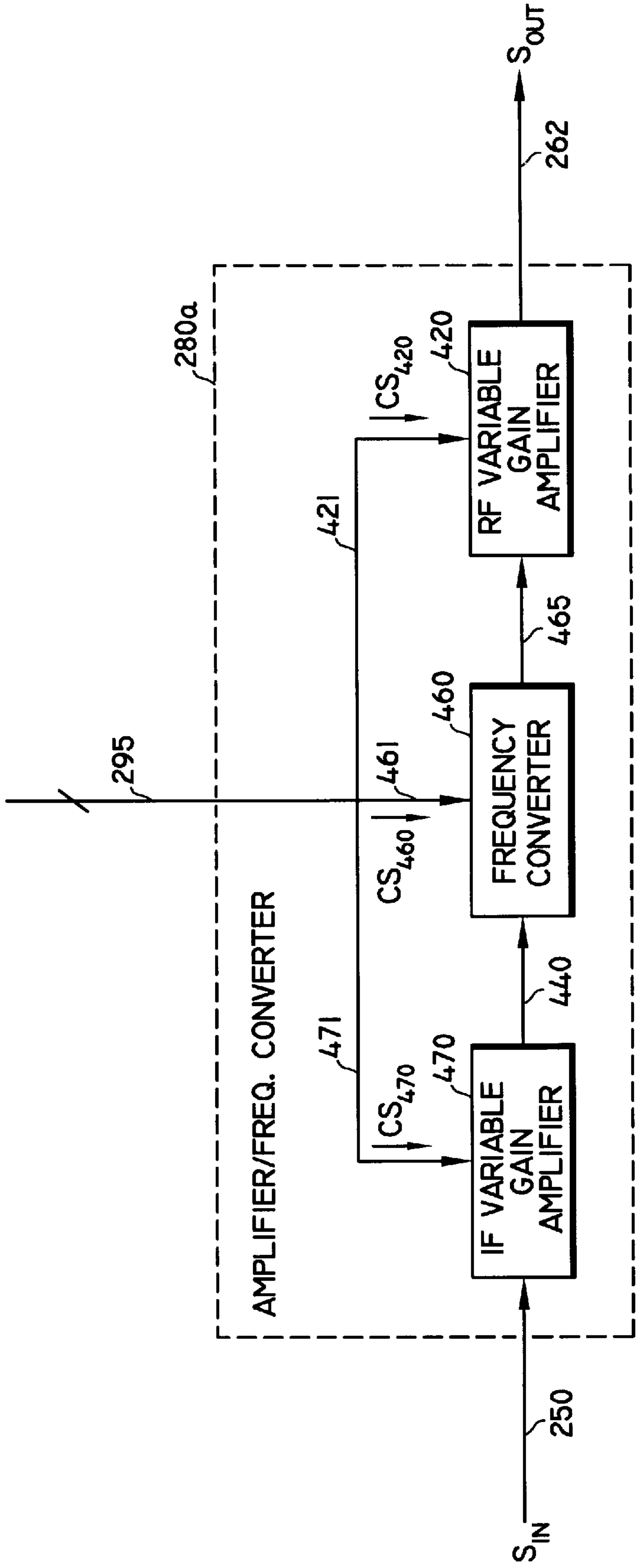
FIG. 4A shows a block diagram of an illustrative amplifier and frequency converter circuit.

FIG. 4A shows an exemplary amplifier and frequency converter circuit 280*a*, which can be used for circuit 280 of FIG. 2. Circuit 280*a* typically includes an intermediate frequency (IF) variable gain amplifier 470, up-converting frequency converter 460 and RF variable gain amplifier 420. The gain of each amplifier 470 and 420 is controlled by a gain control signal (or control word) $CS_{470}$ and $CS_{420}$, respectively, on respective control lines 471 and 421 of control line set 295. The carrier frequency $f_{IN}$ of signal $S_{IN}$ is always provided at the same fixed frequency. Accordingly, gain control signal $CS_{470}$ can be varied by processor 210 as a function of temperature only, so as to provide a temperature-independent gain for amplifier 470. This is effectuated by processor 210 retrieving gain data stored within ROM 215 pertaining to amplifier 470 corresponding to the current temperature conditions as measured and supplied by temperature sensing element 212. An appropriate gain control signal $CS_{470}$ is then derived from the data. An amplified IF output signal having carrier frequency $f_{IN}$ is thus provided on line 440, and applied to frequency converter 460.

Frequency converter 460 up-converts the signal on line 440 to provide a signal on line 465 having the translated frequency $f_{OUT}$, where $f_{OUT}$ is controlled by frequency control signal (or control word) $CS_{460}$ on line 461, originating from processor 210. RF amplifier 420 then amplifies the signal on line 465 at a gain controlled by control signal $CS_{420}$ to produce output signal $S_{OUT}$. Signal $CS_{420}$ can be varied by processor 210 as a function of operating frequency ($f_{OUT}$) and temperature, so as to provide frequency and temperature-independent gain for amplifier 420. Processor 210 derives the proper control signal $CS_{420}$ from stored data in ROM 215 corresponding to the selected frequency $f_{OUT}$ and the measured temperature.

Amplifiers 470 and 420 may each have a digital interface to their respective control line 471 or 421 such that the associated digital control word $CS_{470}$ or $CS_{420}$ is converted to an analog control signal by an internal D/A converter. The analog control signal controls circuit parameters affecting the gain of the device, such as the effective bias voltage present on internal transistor terminals. Alternatively, amplifiers 470 and 420 may be equipped with only an analog interface to the control lines, in which case external D/A converters (not shown) would be employed between the control lines and the amplifiers.

To establish accurate gain data values to be stored within ROM 215, the amplification chain from input line 250 to output line 262 of circuit 280*a* is preferably measured as a unit as a function of operating frequency and temperature. During such measurements, control words $CS_{470}$, $CS_{460}$ and $CS_{420}$ are typically applied to the respective digital interfaces of frequency converter 460 and variable amplifiers 470 and 420. At selected frequency and temperature points, control words $CS_{470}$ and $CS_{420}$ are varied until a specified gain "G" is obtained for the amplification chain from input line 250 to output line 262. Data indicative of such measurements are stored in tables within ROM 215. The control words for $CS_{460}$, which control the output frequency of frequency converter 460, can also be stored in ROM 215. Frequency converter 460 typically provides a highly stable output frequency with temperature, and therefore, control words for $CS_{460}$ are only dependent upon the selected frequency $f_{OUT}$ in the typical case.

Typically, a data value is stored in ROM 215 for control word $CS_{420}$ for every incremental combination of frequency and temperature over specified frequency and temperature ranges. Data values can be stored for control word $CS_{470}$ as a function of temperature only, or as a function of frequency and temperature. For example, if measurements are taken at 100 equally spaced frequencies over the operating frequency range, and at 50 temperatures, then a total of 50×100=5,000 data values can be stored for control word $CS_{420}$, and 50 values for $CS_{470}$. At each of these combinations of frequency and temperature points, the set of these control words, when applied to the respective amplifiers, results in the constant gain G for the amplification chain. Hence, with the data stored in this manner, the control words can be extracted directly during system operation from the data tables and transferred to the amplifiers via the control lines. With this approach, the loss variation of frequency converter 460 with frequency and temperature is effectively compensated for, since the control words $CS_{420}$ and $CS_{470}$ are operative to maintain a constant gain of the overall chain from input line 250 to output line 262. Moreover, if additional components such as filters are employed in series between lines 250 and 262, the loss variations with frequency and temperature of the additional components can analogously be compensated for by means of gain control signals $CS_{420}$ and $CS_{470}$.

During such measurements, the location at which temperature is measured, for example, ambient temperature at a fixed distance from the gain control circuit, or a specific location physically on the gain control circuit itself, is preferably the same location at which temperature is measured by temperature sensing element 212 during system operation.

In any event, it is understood that the gain data may be alternatively be stored in various other formats in ROM 215, and that the actual control words transferred to the control lines may be derived from the stored data with the use of algorithms within processor 210. For example, the control words may be correction signals functioning to correct circuit parameters within the amplifiers that otherwise cause the gain to deviate from a nominal value as temperature and frequency change.

In an alternative embodiment, the variable amplifiers could be measured separately as a function of frequency and temperature, and gain data stored accordingly. This would typically result in less accurate gain when amplifier/frequency converter circuit 280 is assembled; however, this approach does provide some logistical advantages.

Moreover, if the application only requires gain compensation for frequency or temperature, but not both, then the gain measurements and data storage in ROM 215 would be simplified accordingly.

Further, either one or both of variable gain amplifiers 470 and 420 may be comprised of a plurality of additional variable gain amplifiers coupled in series. Gain data as a function of frequency and temperature could be stored within ROM 215 for each of these additional amplifiers, and a separate gain control signal could be provided by processor 210 to each one of the additional amplifiers.

Figure 4B:
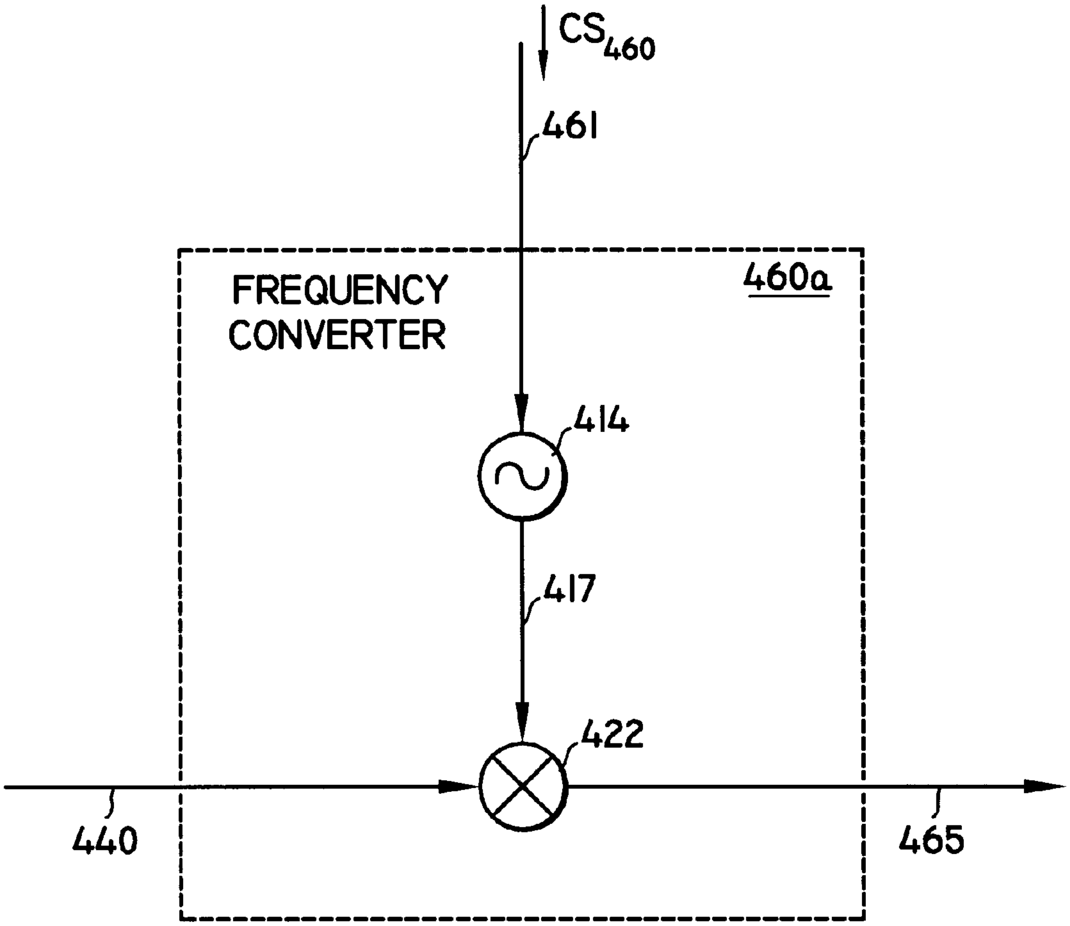
FIG. 4B is a schematic diagram of an exemplary frequency converter.

FIG. 4B schematically illustrates an exemplary frequency converter 460*a*, which can be used for frequency converter 460 of FIG. 4A. Frequency converter 460*a* includes tunable frequency synthesizer 414 and up-converting mixer 422, coupled via line 417. Frequency synthesizer 414 functions to provide a sinusoidal signal on line 417 at a synthesized, variable frequency $f_{LO}$, which is controlled by digital control word $CS_{460}$ on line 461, supplied from processor 210. Mixer 422 mixes the amplified IF signal on line 440, which has frequency $f_{IN}$, with the sinusoidal signal on line 417, to thereby provide a frequency converted signal on line 465 having an up-converted carrier frequency $f_{OUT}=f_{IN}+f_{LO}$. Since the input carrier frequency $f_{IN}$ is always provided at the same fixed frequency, processor 210 controls the output carrier frequency $f_{OUT}$ (operating frequency) by controlling the synthesized frequency $f_{LO}$. (In certain digital modulation schemes, such as frequency shift keying, the modulated input signal $S_{IN}$ will have two or more closely spaced IF carriers, each indicative of a logic state. In this case, frequency converter 460 or 460*a* translates each IF carrier in frequency by the same frequency shift, such that the output signal $S_{OUT}$ contains two or more corresponding up-converted carriers).

Figure 5:
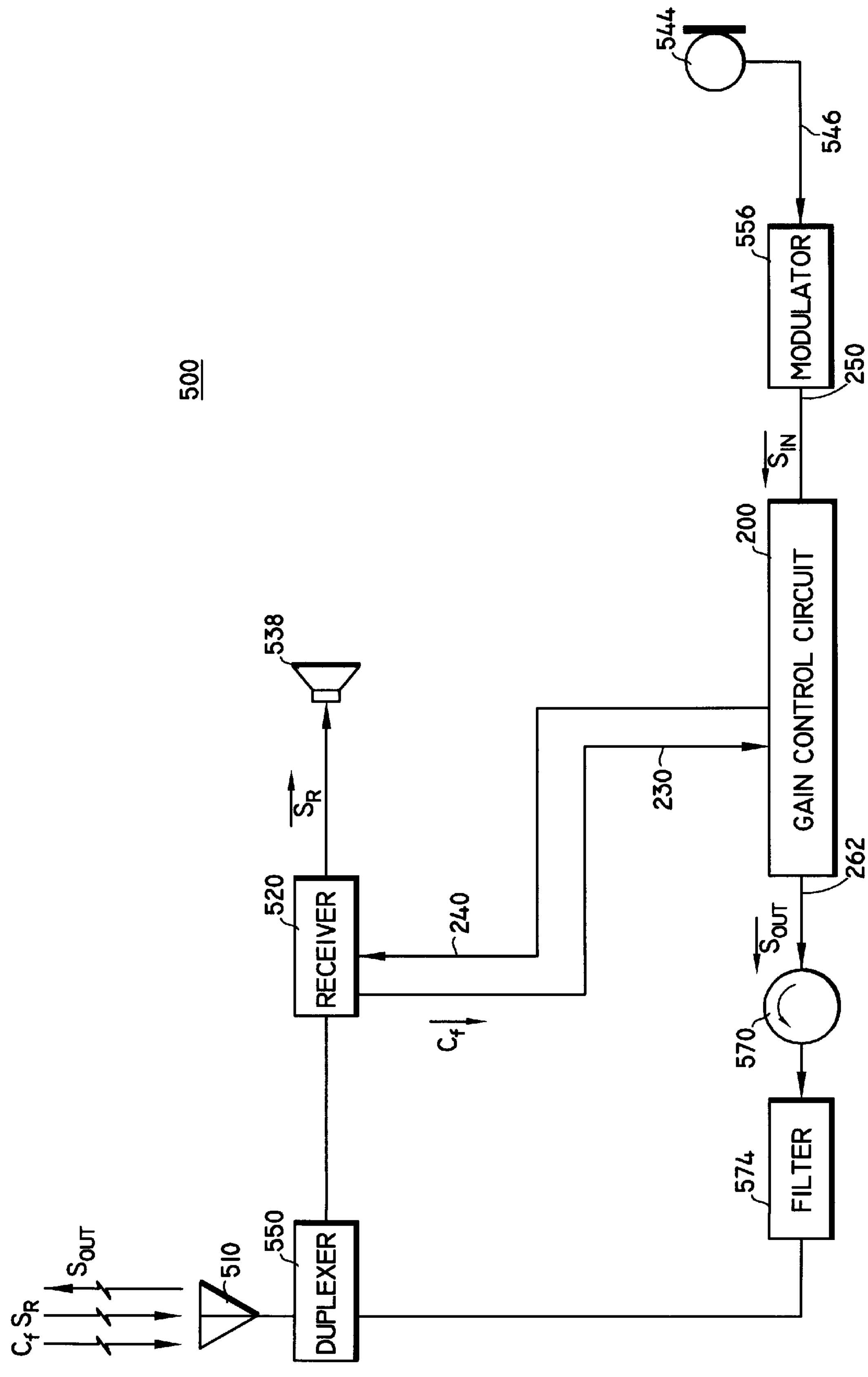
FIG. 5 shows a block diagram of a radio transceiver in accordance with the present invention incorporating the gain control circuit of FIG. 2.

Referring now to FIG. 5, there is illustrated a block diagram of an exemplary radio transceiver in accordance with the present invention, designated generally as 500, which incorporates gain control circuit 200 of FIG. 2. Transceiver 500 may be employed as the transceiver of a wireless communication terminal, e.g., a cellular telephone. The transmitter portion of radio transceiver 500 is shown generally at the bottom-half portion of FIG. 5. An information-bearing signal, for instance, a voice signal, is converted by a transducer, here microphone 544, into electrical form, and an electrical signal indicative of such information-bearing signal is generated on line 546. Line 546 is coupled to modulator 556, which generates a modulated signal $S_{IN}$, such as a frequency modulated (FM) signal, on line 250. The carrier frequency of signal $S_{IN}$ is always provided at a fixed frequency $f_{IN}$. Signal $S_{IN}$ is amplified and up-converted by gain control circuit 200 to produce output signal $S_{OUT}$, which has a variable carrier frequency $f_{OUT}$. Operation of gain control circuit 200, as shown in FIG. 5, is similar to that described above with reference to FIG. 2. The carrier frequency $f_{OUT}$ of signal $S_{OUT}$ is determined by the processor within gain control circuit 200 responsive to frequency channel control signal $C_f$ on line 230. Signal $C_f$, which originates from an external source, such as from a base station, is received by antenna 510 and routed through duplexer 550 and receiver 520 to line 230. The processor within gain control circuit 200 determines and controls, responsive to signal $C_f$, the frequency channel on transmit by controlling the at least one frequency converter within circuit 200. Additionally, the processor within circuit 200 controls the frequency channel on receive, responsive to signal $C_f$, by controlling one or more similar frequency converters within receiver 520 via one or more control signals on line 240. Typically, the receive frequency channel is slightly offset from the transmit channel. Accordingly, an information-bearing receive signal $S_R$ intended for the wireless terminal is received via antenna 510, and routed through duplexer 550 and receiver 520, where it is demodulated and applied to transducer 538 (e.g., speaker).

As was explained previously, gain control circuit 200 typically operates to amplify input signal $S_{IN}$ at a gain that is preferably independent of frequency and temperature to produce signal $S_{OUT}$. Output signal $S_{OUT}$ is then applied in turn to circulator 570, filter 574, duplexer 550 and antenna 510, where it is transmitted.

Figure 6:
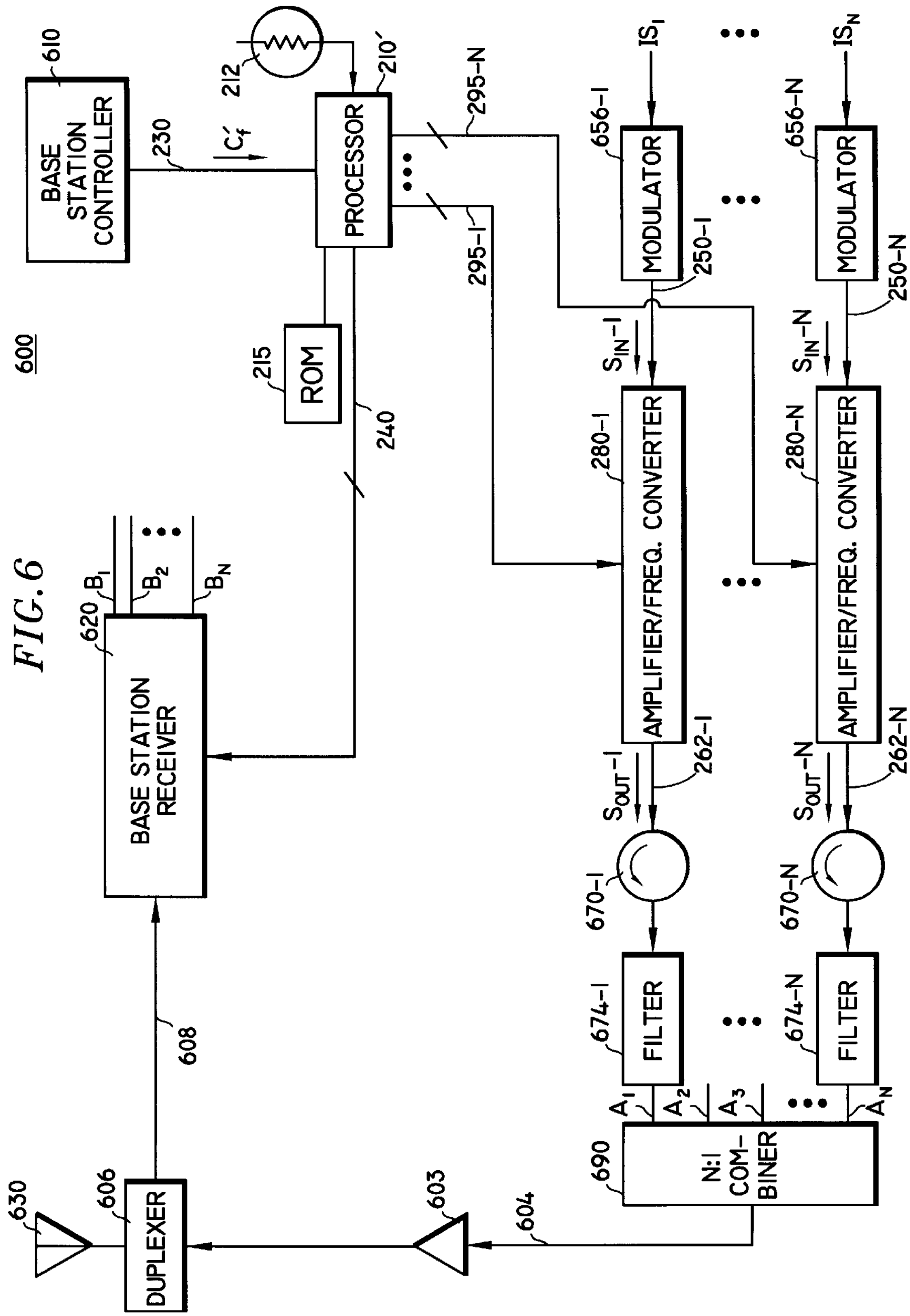
FIG. 6 is a block diagram of a base station radio transceiver employing gain control circuitry in accordance with the present invention.

FIG. 6 is a block diagram of a base station transceiver in accordance with the present invention, designated generally as 600. On the transmit side, a plurality N of baseband information-bearing signals $IS_1$–$IS_N$ are applied to N associated modulators 656-1 to 656-N. The modulators provide, on lines 250-1 to 250-N, respective modulated output signals $S_{IN}$-1 to $S_{IN}$-N, each having the same carrier frequency $f_{IN}$. Each signal $S_{IN}$-i is amplified and up-converted by a respective amplifier/frequency converter circuit 280-i. Each circuit 280-1 to 280-N is functionally equivalent to amplifier/frequency converter 280 described above in reference to FIG. 2. Data indicative of gain as a function of frequency and temperature for variable amplifiers within each of circuits 280-1 to 280-N is stored within ROM 215.

Base station controller 610 supplies a control signal $C_f'$ on line 230, which informs processor 210' as to which up-converted operating frequency should be used for each circuit 280-1 to 280-N. Temperature sensing element 212 measures the temperature in the vicinity of circuits 280-1 to 280-N and supplies the measured temperature information to processor 210'. Processor 210' retrieves gain data within ROM 215 for each circuit 280-1 to 280-N corresponding to the operating frequency of each circuit and to the measured temperature. Processor 210' then provides control words to each of circuits 280-1 to 280-N on respective control line sets 295-1 to 295-N. These control words control the operating frequency and gain of each circuit 280-i in a manner similar to that described above for circuit 280 of FIG. 2. Hence, the gain of the individual variable amplifiers (and variable attenuators, if any) within circuits 280-i is controlled as a function of frequency and temperature. Preferably, a constant gain is realized for each circuit 280-i.

Each circuit 280-i preferably provides, on a respective output line 262-i, a modulated RF output signal $S_{OUT}$-i occupying a distinct frequency channel, such as a 30 KHz wide channel at UHF or microwave frequencies. That is, each output carrier frequency $f_{OUT}$-1 to $f_{OUT}$-N of respective signals $S_{OUT}$-1 to $S_{OUT}$-N can be different. Base station controller 610 thus dynamically allocates a distinct RF frequency channel for transmission of each information-bearing signal $IS_1$–$IS_N$. The frequency allocation is typically based upon the availability of channels and on the frequency dependent communication quality of communication sessions with wireless terminals. If frequency re-use is employed, the same frequency channel can be used for two or more signals $IS_1$–$IS_N$.

Signals $S_{OUT}$-1 to $S_{OUT}$-N are each applied to an associated circulator 670-i, filter 674-i and then to an associated input port $A_1$ to $A_N$ of 1:N power combiner 690. Power combiner 690 provides a combined signal on line 604, which is a frequency division multiplexed (FDM) signal for the case in which each signal $S_{OUT}$-1 to $S_{OUT}$-N occupies a different frequency channel. The combined signal is amplified by linear high power amplifier 603. The amplified output is applied to duplexer 606 and then transmitted by antenna 630 to wireless terminals, e.g., cellular telephones.

Communication signals transmitted by wireless terminals on various frequency channels are received by antenna 630 and routed through duplexer 606, to provide an FDM receive signal on line 608. The FDM receive signal is down-converted and then divided into N receive channels within receiver 620 by the use of a plurality of narrowband IF filters therein (not shown). Down-conversion can be realized by the employment of a plurality of down-converters (not shown), each including a tunable frequency synthesizer that oscillates at a frequency controlled by processor 210' via one of control lines 240. Each tunable synthesizer therein is associated with one of the narrowband IF filters, and also with one of output lines $B_1$–$B_N$. By controlling the frequency of each synthesizer, processor 210' can control which communication channel is provided on a given output line $B_1$–$B_N$.

Typically, in each communication session, transmission and reception occur at frequencies that differ from one another by a fixed frequency offset. Processor 210' thus selects the frequency channels within receiver 620 in correspondence with the operating frequencies selected for circuits 280-1 to 280-N on the transmit side. This enables each communication session to occur over a dynamically alterable frequency channel.

Optionally, processor 210' can also control gain of the various receive paths within receiver 620 so as to maintain a frequency-independent and temperature-independent receiver gain for each channel. This can be accomplished in a similar manner as on the transmit side, by storing additional gain data within ROM 215 indicative of gain of individual amplifiers within receiver 620 as a function of frequency and temperature. Additional gain control signals on lines 240 would then be provided to the individual amplifiers, to correct gain of each amplifier in accordance with the current operating frequency and with the measured temperature information supplied by sensing element 212.

Figure 7:
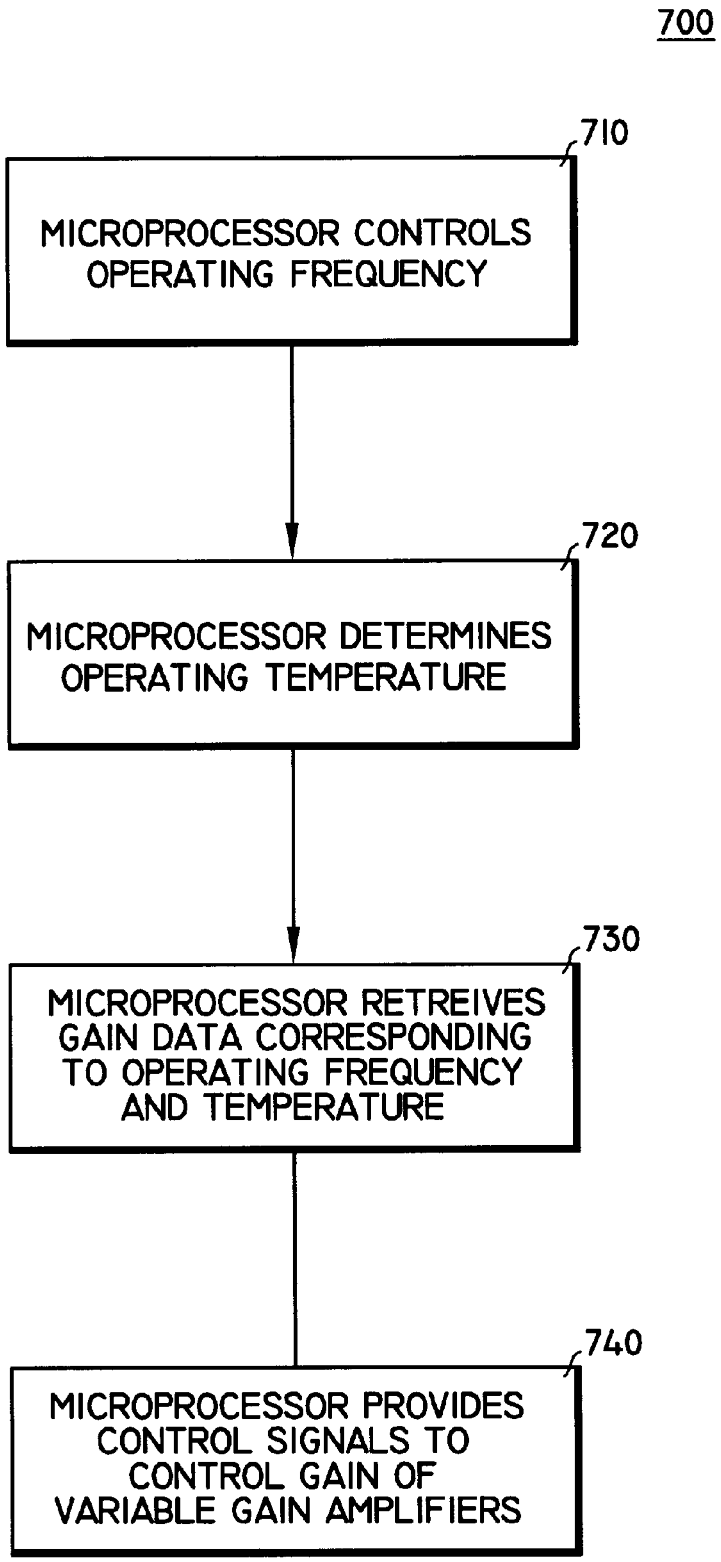
FIG. 7 is a logical flow diagram illustrating method steps of a method in accordance with the present invention.

Turning finally now to the logical flow diagram of FIG. 7, the method steps of a gain control method in accordance with the present invention, referred to generally by reference numeral 700, will be described below in reference to FIG. 2. First, and as indicated by block 710, microprocessor 210 controls the one or more frequency converters within amplifier/frequency converter circuit 280 to control the operating frequency of the output signal Sour to be transmitted. Processor 210 then determines the operating temperature of the circuit through utilization of temperature sensing element 212, block 720. Processor 210 then retrieves gain data stored within ROM 215 corresponding to the operating frequency and temperature, block 730. Finally, as indicated by block 740, the gain of each variable amplifier within circuit 280 is altered by processor 210 responsive to the operating frequency and the current operating temperature, so as to maintain a flat gain for the circuit, independent of frequency and temperature.

Although the present invention has been described with emphasis on a particular embodiment for maintaining gain flatness as shown in the various figures, it is to be understood that other similar embodiments may be used and modifications and additions may be made to the described embodiments for preforming the same function of the present invention without departing therefrom. Therefore, the present invention should not be limited to any single embodiment, but rather construed in breadth and scope in accordance with the recitation of the appended claims.

What is claimed is:

1. A gain control circuit for amplifying an input signal having a first carrier frequency to produce an amplified output signal, comprising:

a variable frequency converter for converting said input signal to a frequency converted signal having a second, translated carrier frequency responsive to a frequency control signal applied thereto;

variable gain circuitry for amplifying said frequency converted signal at a gain responsive to a gain control signal applied thereto to produce said amplified output signal;

a memory having stored data indicative of gain of said variable gain circuitry as a function of frequency; and a processor having input means for receiving a frequency transmit control signal from a receiver for determining said second carrier frequency and supplying said frequency control signal to said frequency converter to thereby maintain said second carrier frequency substantially constant, said processor also operable to retrieve said stored data from said memory corresponding to said second carrier frequency, and to provide said gain control signal, determined from said data retrieved, to maintain the gain of said variable gain circuitry substantially constant, wherein said receiver, said processor, and said variable frequency converter are connected in series.

2. The gain control circuit according to claim 1, wherein said stored data is further indicative of gain of said variable gain circuitry as a function of temperature, and wherein said gain control circuit further includes:

a temperature sensing element coupled to said processor, for determining temperature conditions of said variable gain circuitry and supplying associated temperature information to said processor;

wherein said processor is further operable to determine said gain control signal from said stored data corresponding to said temperature information and said second carrier frequency, whereby gain of said variable gain circuitry is controllable as a function of temperature and said second carrier frequency.

3. The gain control circuit according to claim 2, wherein said gain of said variable gain circuitry is controllable to provide substantially constant gain over predetermined operating frequency and temperature ranges.

4. The gain control circuit according to claim 3, wherein said input signal comprises a modulated information-bearing signal.

5. The gain control circuit according to claim 4, wherein said data indicative of gain of said variable gain circuitry comprises pre-measured gain data of said variable gain circuitry.

6. The gain control circuit according to claim 5, further including a first variable gain amplifier, coupled to an input port of said frequency converter, for amplifying a modulated, information-bearing signal to produce said input signal, and further wherein:

said variable gain circuitry comprises a second variable gain amplifier, coupled to an output port of said frequency converter, for amplifying an up-converted radio frequency (RF) signal indicative of said information-bearing signal to produce said amplified output signal.

7. The gain control circuit according to claim 6, wherein:

said memory further includes stored data indicative of gain of said first variable gain amplifier as a function of temperature; and said processor is operative to provide a further gain control signal to said first variable gain amplifier to control gain thereof, determined from said stored data corresponding to said temperature information.

8. The gain control circuit according to claim 7, wherein:

said first and second variable gain amplifiers each have gain controllable responsive to respective first and second control words applied thereto; and said gain data of said first and second variable gain amplifiers stored within said memory is such as to provide a substantially constant gain, over an operating frequency range and temperature range, of a series circuit portion comprised of said first amplifier, said frequency converter, and said second amplifier.

9. The gain control circuit according to claim 1, wherein said first carrier frequency of said input signal is a predetermined, fixed carrier frequency.

10. The gain control circuit according to claim 1, wherein said variable frequency converter comprises:

a tunable frequency synthesizer, coupled to said processor, for receiving said frequency control signal and providing a sinusoidal signal at a local oscillating frequency responsive to said frequency control signal; and an up-converting mixer, coupled to said frequency synthesizer and to said variable gain circuitry, for mixing said input signal with said sinusoidal signal to produce said frequency converted signal.

11. The gain control circuit according to claim 1, wherein said gain control circuit forms a portion of a radio transmitter of a wireless communication terminal, and further wherein said processor is operable to deter mine said second carrier frequency responsive to a frequency channel control signal received by said wireless communication terminal.

12. The gain control circuit according to claim 11, wherein:

said frequency channel control signal is wirelessly transmitted to said wireless terminal;

said wireless terminal includes an antenna and a receiver, said antenna receiving said frequency channel control signal and providing said frequency channel control signal to said receiver;

said receiver operative to provide said frequency channel control signal to said processor; and said processor further operative to control a receive frequency channel of said receiver responsive to said frequency channel control signal.

13. The gain control circuit according to claim 2, wherein said temperature sensing element comprises a thermistor.

14. The gain control circuit according to claim 1, wherein said processor is operable to control gain of said variable gain circuitry in a feedback-free manner.

15. The gain control circuit according to claim 2, wherein said data indicative of gain of said variable gain circuitry comprises correction data to correct the gain of said variable gain circuitry when said second carrier frequency and operating temperature of said gain control circuit differs from a predetermined operating frequency and temperature.

16. Base station transmitter circuitry for a wireless telecommunication system, comprising:

a plurality of variable gain amplification circuits, each for amplifying and up-converting an associated one of a plurality of modulated input signals;

a memory having stored data indicative of gain of each said amplification circuit as a function of frequency;

a processor, coupled to said memory and to said amplification circuits, for providing a frequency control signal to each said amplification circuit to maintain the up-converted frequency of the modulated input signal amplified therein substantially constant;

said processor further operable to provide at least one gain control signal to each said amplification circuit to maintain the gain thereof substantially constant, wherein each said gain control signal is derived from said stored data corresponding to the up-converted frequency of the associated amplification circuit, wherein said processor is coupled to each of said plurality of variable gain amplification circuits in series.

17. Base station transmitter circuitry according to claim 16, further comprising a temperature sensing element for determining temperature conditions of said transmitter circuitry and supplying associated temperature information to said processor, and further wherein:

said stored data within said memory is further indicative of gain of each said amplification circuit as a function of frequency and temperature; and said processor is further operable to determine said gain control signals from said stored data corresponding to said temperature information and said up-converted frequencies, whereby gain of each said amplification circuit is controllable as a function of frequency and temperature.

18. Base station transmitter circuitry according to claim 16, wherein the up-converted frequency of the modulated signal within each said amplification circuit is different.

19. Base station transmitter circuitry according to claim 18, further including:

a plurality of modulators, each for modulating an associated one of a plurality of information-bearing signals to provide an associated one of said modulated input signals; and a combiner for combining amplified and up-converted radio frequency (RF) output signals of said amplification circuits to produce a frequency division multiplexed (FDM) signal for transmission to wireless terminals.

20. Base station transmitter circuitry according to claim 16, wherein said processor is operative to provide said frequency control signals responsive to at least one frequency channel control signal provided to said processor from a base station controller.

21. Base station transmitter circuitry according to claim 19, further including in combination therewith, a base station receiver for receiving selected communication signals transmitted by wireless terminals over a range of frequency channels, wherein said processor is operative to select said communication signals received by controlling receiver frequency channels within said receiver, each said receiver frequency channel being related to a corresponding one of said up-converted frequencies.

22. A method for amplifying and frequency translating an input signal having a first carrier frequency to produce an amplified output signal, comprising the steps of:

applying said input signal to a variable frequency converter to produce a frequency converted signal having a frequency within an operating frequency range of variable gain amplifier circuitry;

applying said frequency converted signal to variable gain amplifier circuitry to produce said output signal;

storing data indicative of gain of said variable gain circuitry as a function of operating frequency within a memory storage unit;

deriving a gain control signal from said stored data corresponding to said frequency within the operating frequency range; and applying said gain control signal to said variable gain circuitry from a processor coupled to said memory storage unit to maintain gain thereof substantially constant over the operating frequency range of the variable gain circuitry, wherein said processor is connected to said variable frequency converter in series.

23. The method according to claim 22, further comprising:

storing gain data indicative of gain of said variable gain circuitry as a function of temperature;

monitoring temperature conditions of said variable gain circuitry; and deriving said gain control signal further as a function of said stored data corresponding to said temperature conditions.

24. A gain control circuit for amplifying an input signal having a first carrier frequency to produce an amplified output signal, comprising:

variable frequency converter means for converting said input signal to a frequency converted signal having a second, translated carrier frequency responsive to a frequency control signal applied thereto;

variable gain circuitry means for amplifying said frequency converted signal at a gain responsive to a gain control signal applied thereto to produce said amplified output signal;

memory means for storing data indicative of gain of said variable gain circuitry means as a function of frequency; and processor ter means to thereby maintain said second carrier frequency substantially constant, said processor means also operable to retrieve said stored data from said memory means corresponding to said second carrier frequency, and to provide said gain control signal, determined from said stored data retrieved, to maintain the gain of said variable gain circuitry means substantially constant, wherein said processor means and said frequency converter means are connected in series.

* * * * *